United States Patent
Cousinard et al.

(10) Patent No.: US 8,923,788 B1
(45) Date of Patent: *Dec. 30, 2014

(54) CIRCUIT AND METHOD FOR ADJUSTING A DIGITALLY CONTROLLED OSCILLATOR

(71) Applicant: Marvell International Ltd., Hamilton (BM)

(72) Inventors: David Cousinard, Morges (CH); Cao-Thong Tu, Preverenges (CH); Miljan Vuletic, Lausanne (CH); Lydi Smaini, Savigny (CH)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/089,515

(22) Filed: Nov. 25, 2013

Related U.S. Application Data (63) Continuation of application No. 12/487,425, filed on Jun. 18, 2009, now Pat. No. 8,600,324.

(60) Provisional application No. 61/076,461, filed on Jun. 27, 2008.

(51) Int. Cl.
 H03J 7/32 (2006.01)
 H04B 1/18 (2006.01)
 H04B 1/06 (2006.01)
 H04B 7/00 (2006.01)
 H04B 1/26 (2006.01)
 H03J 7/18 (2006.01)

(52) U.S. Cl.
 CPC ........................................ H03J 7/18 (2013.01)
 USPC ......... 455/192.1; 455/147; 455/255; 455/323

(58) Field of Classification Search
 USPC ................ 455/77, 550.1, 131, 139, 147, 148, 455/151.3, 182.2, 190.1, 192.1, 192.2, 255, 455/258, 259, 318, 323
 See application file for complete search history.

(56) References Cited

U.S. PATENT DOCUMENTS

| 4,337,463 A | 6/1982 | Vangen |
| 4,805,215 A | 2/1989 | Miller |

(Continued)

FOREIGN PATENT DOCUMENTS

| CN | 102067689 | 5/2011 |
| EP | 1860827 | 11/2007 |

(Continued)

OTHER PUBLICATIONS

"3rd Generation Partnership Project; Technical Specification Group Radio Access Network; Evolved Universal Terrestrial Radio Access (E-UTRA); Radio Resource Control (RRC); Protocol Specification (Release 10)", 3GPP TS 36.331; V10.5.0; 3GPP Organizational Partners, 2012, 302 pages.

(Continued)

*Primary Examiner* — Andrew Wendell (57) ABSTRACT

In one embodiment the present invention includes a method of generating an oscillating signal at different frequencies. The method comprises configuring a digitally controlled oscillator (DCO). The DCO is configured to generate the oscillating signal at a first frequency, and the DCO is configured to generate the oscillating signal at a second frequency. Additionally, the DCO is configured to transition from the first frequency to the second frequency during a transition time period. During the transition time period, the DCO activates the second frequency and deactivates the first frequency during a plurality of time intervals. The time intervals for activating the second frequency and deactivating the first frequency successively increase from the beginning of the transition time period to the end of the transition time period.

20 Claims, 8 Drawing Sheets

(56) References Cited

U.S. PATENT DOCUMENTS

| | | |
|---|---|---|
| 5,347,234 A | 9/1994 | Gersbach et al. |
| 5,634,207 A | 5/1997 | Yamaji et al. |
| 5,673,291 A | 9/1997 | Dent |
| 5,708,656 A | 1/1998 | Noneman et al. |
| 5,847,616 A | 12/1998 | Ng et al. |
| 5,995,819 A | 11/1999 | Yamaji et al. |
| 6,167,245 A | 12/2000 | Welland et al. |
| 6,285,262 B1 | 9/2001 | Kuriyama |
| 6,320,919 B1 | 11/2001 | Khayrallah et al. |
| 6,347,091 B1 | 2/2002 | Wallentin et al. |
| 6,366,622 B1 | 4/2002 | Brown et al. |
| 6,374,117 B1 | 4/2002 | Denkert et al. |
| 6,438,364 B1 | 8/2002 | Waite |
| 6,452,458 B1 | 9/2002 | Tanimoto |
| 6,509,777 B2 | 1/2003 | Razavi et al. |
| 6,519,461 B1 | 2/2003 | Andersson et al. |
| 6,535,037 B2 | 3/2003 | Maligeorgos |
| 6,553,229 B1 | 4/2003 | Dent |
| 6,640,308 B1 | 10/2003 | Keyghobad et al. |
| 6,650,195 B1 | 11/2003 | Brunn et al. |
| 6,675,328 B1 | 1/2004 | Krishnamachari et al. |
| 6,738,358 B2 | 5/2004 | Bist et al. |
| 6,741,846 B1 | 5/2004 | Welland et al. |
| 6,741,862 B2 | 5/2004 | Chung et al. |
| 6,754,189 B1 | 6/2004 | Cloutier et al. |
| 6,816,452 B1 | 11/2004 | Maehata |
| 6,816,718 B2 | 11/2004 | Yan et al. |
| 6,922,433 B2 | 7/2005 | Tamura |
| 6,934,566 B2 | 8/2005 | Kang et al. |
| 6,946,950 B1 | 9/2005 | Ueno et al. |
| 6,954,708 B2 | 10/2005 | Rakshani et al. |
| 7,079,811 B2 | 7/2006 | Lee et al. |
| 7,139,540 B2 | 11/2006 | Wu et al. |
| 7,173,431 B1 | 2/2007 | Lo et al. |
| 7,206,840 B2 | 4/2007 | Choi et al. |
| 7,212,798 B1 | 5/2007 | Adams et al. |
| 7,239,882 B1 | 7/2007 | Cook |
| 7,257,095 B2 | 8/2007 | Liu |
| 7,286,009 B2 | 10/2007 | Andersen et al. |
| 7,298,183 B2 | 11/2007 | Mirzaei et al. |
| 7,310,023 B2 | 12/2007 | Cha et al. |
| 7,319,849 B2 | 1/2008 | Womac |
| 7,342,895 B2 | 3/2008 | Serpa et al. |
| 7,355,416 B1 | 4/2008 | Darshan |
| 7,377,441 B2 | 5/2008 | Wiklof et al. |
| 7,395,040 B2 | 7/2008 | Behzad |
| 7,403,018 B1 | 7/2008 | Lo et al. |
| 7,529,548 B2 | 5/2009 | Sebastian |
| 7,564,826 B2 | 7/2009 | Sherman et al. |
| 7,595,768 B2 | 9/2009 | Li et al. |
| 7,599,671 B2 | 10/2009 | Kopikare et al. |
| 7,616,935 B2 | 11/2009 | Fernandez-Corbaton et al. |
| 7,626,966 B1 | 12/2009 | Ruiter et al. |
| 7,627,025 B2 | 12/2009 | Wang et al. |
| 7,627,026 B2 | 12/2009 | Wang et al. |
| 7,636,388 B2 | 12/2009 | Wang et al. |
| 7,656,205 B2 | 2/2010 | Chen et al. |
| 7,659,003 B2 | 2/2010 | Aoki et al. |
| 7,672,645 B2 | 3/2010 | Kilpatrick et al. |
| 7,689,190 B2 | 3/2010 | Kerth et al. |
| 7,711,004 B2 | 5/2010 | Xu |
| 7,717,342 B2 | 5/2010 | Wang |
| 7,734,253 B2 | 6/2010 | Chen et al. |
| 7,826,411 B2 | 11/2010 | Gonikberg et al. |
| 7,849,333 B2 | 12/2010 | Schindler |
| 7,876,786 B2 | 1/2011 | Bahl et al. |
| 7,881,746 B2 | 2/2011 | Desai |
| 7,898,948 B2 | 3/2011 | DiGirolamo et al. |
| 7,936,714 B1 | 5/2011 | Karr et al. |
| 7,957,340 B2 | 6/2011 | Choi et al. |
| 7,966,036 B2 | 6/2011 | Kojima |
| 7,995,544 B2 | 8/2011 | Benveniste |
| 8,000,715 B2 | 8/2011 | Melpignano et al. |
| 8,014,329 B2 | 9/2011 | Gong |
| 8,045,922 B2 | 10/2011 | Sherman et al. |
| 8,060,017 B2 | 11/2011 | Schlicht et al. |
| 8,072,913 B2 | 12/2011 | Desai |
| 8,077,652 B2 | 12/2011 | Thesling |
| 8,078,111 B2 | 12/2011 | Jovicic et al. |
| 8,081,038 B2 | 12/2011 | Lee et al. |
| 8,107,391 B2 | 1/2012 | Wu et al. |
| 8,126,502 B2 | 2/2012 | Trainin |
| 8,139,670 B1 | 3/2012 | Son et al. |
| 8,140,075 B2 | 3/2012 | Watanabe |
| 8,149,715 B1 | 4/2012 | Goel |
| 8,150,328 B2 | 4/2012 | Chaudhri et al. |
| 8,165,102 B1 | 4/2012 | Vleugels et al. |
| 8,170,002 B2 | 5/2012 | Wentink |
| 8,170,546 B2 | 5/2012 | Bennett |
| 8,189,506 B2 | 5/2012 | Kneckt et al. |
| 8,204,015 B2 | 6/2012 | Chaudhri et al. |
| 8,229,087 B2 | 7/2012 | Sumioka et al. |
| 8,254,296 B1 | 8/2012 | Lambert et al. |
| 8,256,681 B2 | 9/2012 | Wang |
| 8,274,894 B2 | 9/2012 | Kneckt et al. |
| 8,275,314 B1 | 9/2012 | Lin |
| 8,310,967 B1 | 11/2012 | Goel |
| 8,315,564 B2 | 11/2012 | Banerjea |
| 8,340,034 B1 | 12/2012 | Lee |
| 8,364,188 B2 | 1/2013 | Srinivasan et al. |
| 8,369,782 B1 | 2/2013 | Lin et al. |
| 8,472,427 B1 | 6/2013 | Wheeler et al. |
| 8,472,968 B1 | 6/2013 | Kim |
| 8,493,992 B2 | 7/2013 | Sella et al. |
| 8,496,181 B2 | 7/2013 | Wang |
| 8,526,348 B2 | 9/2013 | Desai |
| 8,532,041 B1 | 9/2013 | Lambert et al. |
| 8,553,561 B1 | 10/2013 | Chokshi et al. |
| 8,571,479 B2 | 10/2013 | Banerjea |
| 8,577,305 B1 | 11/2013 | Rossi et al. |
| 8,588,705 B1 | 11/2013 | Tsui et al. |
| 8,599,814 B1 | 12/2013 | Vleugels et al. |
| 8,600,324 B1 | 12/2013 | Cousinard et al. |
| 8,626,067 B2 | 1/2014 | Ko et al. |
| 8,649,734 B1 | 2/2014 | Lin et al. |
| 8,655,278 B2 | 2/2014 | Laroche et al. |
| 8,655,279 B2 | 2/2014 | Banerjea |
| 8,665,848 B2 | 3/2014 | Wentink |
| 8,897,706 | 11/2014 | Lin et al. |
| 2002/0025810 A1 | 2/2002 | Takayama et al. |
| 2002/0049854 A1 | 4/2002 | Cox et al. |
| 2002/0102941 A1 | 8/2002 | Kuiri et al. |
| 2003/0040316 A1 | 2/2003 | Stanforth et al. |
| 2003/0148750 A1 | 8/2003 | Yan et al. |
| 2003/0198200 A1 | 10/2003 | Diener et al. |
| 2004/0044489 A1 | 3/2004 | Jones et al. |
| 2004/0063403 A1 | 4/2004 | Durrant |
| 2004/0105401 A1 | 6/2004 | Lee |
| 2004/0110470 A1 | 6/2004 | Tsien et al. |
| 2004/0162106 A1 | 8/2004 | Monroe et al. |
| 2004/0192222 A1 | 9/2004 | Vaisanen et al. |
| 2004/0198297 A1 | 10/2004 | Oh et al. |
| 2004/0214575 A1 | 10/2004 | Jovanovic |
| 2004/0233881 A1 | 11/2004 | Kang et al. |
| 2005/0018641 A1 | 1/2005 | Zhao et al. |
| 2005/0025104 A1 | 2/2005 | Fischer et al. |
| 2005/0025174 A1 | 2/2005 | Fischer et al. |
| 2005/0038876 A1 | 2/2005 | Chaudhuri |
| 2005/0058151 A1 | 3/2005 | Yeh |
| 2005/0064840 A1 | 3/2005 | Heydari et al. |
| 2005/0090218 A1 | 4/2005 | Ishida et al. |
| 2005/0120119 A1 | 6/2005 | Bhanu et al. |
| 2005/0135360 A1 | 6/2005 | Shin et al. |
| 2005/0174962 A1 | 8/2005 | Gurevich |
| 2005/0186962 A1 | 8/2005 | Yoneyama et al. |
| 2005/0206554 A1 | 9/2005 | Yamaura |
| 2005/0215197 A1 | 9/2005 | Chen et al. |
| 2005/0250528 A1 | 11/2005 | Song et al. |
| 2005/0254423 A1 | 11/2005 | Berghoff |
| 2005/0281278 A1 | 12/2005 | Black et al. |
| 2006/0007863 A1 | 1/2006 | Naghian |
| 2006/0049880 A1 | 3/2006 | Rein et al. |
| 2006/0063509 A1 | 3/2006 | Pincu et al. |
| 2006/0079232 A1 | 4/2006 | Omori et al. |

(56) References Cited

U.S. PATENT DOCUMENTS

| | | |
|---|---|---|
| 2006/0114044 A1 | 6/2006 | Mintchev et al. |
| 2006/0120338 A1 | 6/2006 | Hwang et al. |
| 2006/0128308 A1 | 6/2006 | Michael et al. |
| 2006/0128347 A1 | 6/2006 | Piriyapoksombut et al. |
| 2006/0189359 A1 | 8/2006 | Kammer et al. |
| 2006/0199565 A1 | 9/2006 | Ammirata |
| 2006/0200862 A1 | 9/2006 | Olson et al. |
| 2006/0215601 A1 | 9/2006 | Vleugels et al. |
| 2006/0223474 A1 | 10/2006 | Yoshizaki et al. |
| 2006/0239443 A1 | 10/2006 | Oxford et al. |
| 2006/0251198 A1 | 11/2006 | Ma et al. |
| 2006/0252418 A1 | 11/2006 | Quinn et al. |
| 2006/0264179 A1 | 11/2006 | Bonneville et al. |
| 2006/0268756 A1 | 11/2006 | Wang et al. |
| 2006/0268804 A1 | 11/2006 | Kim et al. |
| 2006/0281404 A1 | 12/2006 | Lee et al. |
| 2006/0282541 A1 | 12/2006 | Hiroki |
| 2006/0282667 A1 | 12/2006 | Kim et al. |
| 2006/0286935 A1 | 12/2006 | Utsunomiya et al. |
| 2007/0010237 A1 | 1/2007 | Jones et al. |
| 2007/0010247 A1 | 1/2007 | Mouna-Kingue et al. |
| 2007/0014314 A1 | 1/2007 | O'Neil |
| 2007/0026810 A1 | 2/2007 | Love et al. |
| 2007/0077908 A1 | 4/2007 | Vorenkamp et al. |
| 2007/0081553 A1 | 4/2007 | Cicchetti et al. |
| 2007/0103829 A1 | 5/2007 | Darshan et al. |
| 2007/0109973 A1 | 5/2007 | Trachewsky |
| 2007/0142080 A1 | 6/2007 | Tanaka et al. |
| 2007/0173286 A1 | 7/2007 | Carter et al. |
| 2007/0178888 A1 | 8/2007 | Alfano et al. |
| 2007/0183443 A1 | 8/2007 | Won |
| 2007/0200622 A1 | 8/2007 | Filoramo et al. |
| 2007/0202814 A1 | 8/2007 | Ono et al. |
| 2007/0206519 A1 | 9/2007 | Hansen et al. |
| 2007/0206762 A1 | 9/2007 | Chandra et al. |
| 2007/0223430 A1 | 9/2007 | Desai et al. |
| 2007/0238482 A1 | 10/2007 | Rayzman et al. |
| 2007/0242645 A1 | 10/2007 | Stephenson et al. |
| 2007/0264959 A1 | 11/2007 | Carrez |
| 2007/0268862 A1 | 11/2007 | Singh et al. |
| 2007/0280471 A1 | 12/2007 | Fallahi et al. |
| 2007/0286298 A1 | 12/2007 | Choi et al. |
| 2007/0297388 A1 | 12/2007 | Appaji et al. |
| 2008/0027033 A1 | 1/2008 | Gonda et al. |
| 2008/0045162 A1 | 2/2008 | Rofougaran et al. |
| 2008/0056201 A1 | 3/2008 | Bennett |
| 2008/0069034 A1 | 3/2008 | Buddhikot et al. |
| 2008/0076466 A1 | 3/2008 | Larsson |
| 2008/0080446 A1 | 4/2008 | Chung |
| 2008/0095058 A1 | 4/2008 | Dalmases et al. |
| 2008/0095059 A1 | 4/2008 | Chu |
| 2008/0111639 A1 | 5/2008 | Ryckaert et al. |
| 2008/0129118 A1 | 6/2008 | Diab |
| 2008/0130595 A1 | 6/2008 | Abdel-Kader |
| 2008/0137580 A1 | 6/2008 | Axelsson et al. |
| 2008/0139212 A1 | 6/2008 | Chen et al. |
| 2008/0161031 A1 | 7/2008 | Tu |
| 2008/0170550 A1 | 7/2008 | Liu et al. |
| 2008/0181154 A1 | 7/2008 | Sherman |
| 2008/0187003 A1 | 8/2008 | Becker |
| 2008/0232287 A1 | 9/2008 | Shao et al. |
| 2008/0238679 A1 | 10/2008 | Rofougaran et al. |
| 2008/0259846 A1 | 10/2008 | Gonikberg et al. |
| 2008/0261552 A1 | 10/2008 | Chung |
| 2008/0261640 A1 | 10/2008 | Yoshida |
| 2008/0262991 A1 | 10/2008 | Kapoor et al. |
| 2008/0272818 A1 | 11/2008 | Ko |
| 2008/0279163 A1 | 11/2008 | Desai |
| 2008/0310067 A1 | 12/2008 | Diab et al. |
| 2008/0320108 A1 | 12/2008 | Murty et al. |
| 2009/0005061 A1 | 1/2009 | Ward et al. |
| 2009/0010210 A1 | 1/2009 | Hiertz et al. |
| 2009/0067396 A1 | 3/2009 | Fischer |
| 2009/0137206 A1 | 5/2009 | Sherman et al. |
| 2009/0240998 A1 | 5/2009 | Sherman et al. |
| 2009/0143043 A1 | 6/2009 | Yoshizaki et al. |
| 2009/0168686 A1 | 7/2009 | Love et al. |
| 2009/0168725 A1 | 7/2009 | Mishra |
| 2009/0170497 A1 | 7/2009 | Miao et al. |
| 2009/0175250 A1 | 7/2009 | Mathur et al. |
| 2009/0190541 A1 | 7/2009 | Abedi |
| 2009/0196210 A1 | 8/2009 | Desai |
| 2009/0202013 A1 | 8/2009 | Sebastian |
| 2009/0209288 A1 | 8/2009 | Rofougaran |
| 2009/0239471 A1 | 9/2009 | Tran et al. |
| 2009/0245133 A1 | 10/2009 | Gupta et al. |
| 2009/0245279 A1 | 10/2009 | Wan et al. |
| 2009/0247217 A1 | 10/2009 | Hsu et al. |
| 2009/0268652 A1 | 10/2009 | Kneckt et al. |
| 2009/0280762 A1 | 11/2009 | Park et al. |
| 2009/0285264 A1 | 11/2009 | Aldana et al. |
| 2009/0291640 A1 | 11/2009 | Bhattad et al. |
| 2009/0311961 A1 | 12/2009 | Banerjea |
| 2009/0312027 A1 | 12/2009 | Foschini et al. |
| 2009/0321056 A1 | 12/2009 | Ran et al. |
| 2010/0009675 A1 | 1/2010 | Wijting et al. |
| 2010/0011231 A1 | 1/2010 | Banerjea et al. |
| 2010/0029325 A1 | 2/2010 | Wang et al. |
| 2010/0052796 A1 | 3/2010 | Menkhoff |
| 2010/0061244 A1 | 3/2010 | Meier et al. |
| 2010/0062799 A1 | 3/2010 | Ishii et al. |
| 2010/0069112 A1 | 3/2010 | Sun et al. |
| 2010/0080319 A1 | 4/2010 | Blocher et al. |
| 2010/0082957 A1 | 4/2010 | Iwata |
| 2010/0097952 A1 | 4/2010 | McHenry et al. |
| 2010/0103867 A1 | 4/2010 | Kishiyama et al. |
| 2010/0130129 A1 | 5/2010 | Chang et al. |
| 2010/0135256 A1 | 6/2010 | Lee et al. |
| 2010/0138549 A1 | 6/2010 | Goel et al. |
| 2010/0165896 A1 | 7/2010 | Gong et al. |
| 2010/0216497 A1 | 8/2010 | Kawasaki |
| 2010/0238793 A1 | 9/2010 | Alfano et al. |
| 2010/0248734 A1 | 9/2010 | Yamazaki et al. |
| 2010/0283654 A1 | 11/2010 | Waheed et al. |
| 2010/0293293 A1 | 11/2010 | Beser |
| 2010/0303026 A1 | 12/2010 | Chaudhri et al. |
| 2010/0316027 A1 | 12/2010 | Rick et al. |
| 2010/0322213 A1 | 12/2010 | Liu et al. |
| 2011/0002226 A1 | 1/2011 | Bhatti |
| 2011/0007675 A1 | 1/2011 | Chiou et al. |
| 2011/0009074 A1 | 1/2011 | Hsu et al. |
| 2011/0021240 A1 | 1/2011 | Hiltunen et al. |
| 2011/0053522 A1 | 3/2011 | Rofougaran et al. |
| 2011/0097998 A1 | 4/2011 | Ko et al. |
| 2011/0103363 A1 | 5/2011 | Bennett |
| 2011/0161697 A1 | 6/2011 | Qi et al. |
| 2011/0164538 A1 | 7/2011 | Karr et al. |
| 2011/0188391 A1 | 8/2011 | Sella et al. |
| 2011/0194519 A1 | 8/2011 | Habetha |
| 2011/0205924 A1 | 8/2011 | Gonikberg et al. |
| 2011/0274040 A1 | 11/2011 | Pani et al. |
| 2012/0020319 A1 | 1/2012 | Song et al. |
| 2012/0025921 A1 | 2/2012 | Yang et al. |
| 2012/0087341 A1 | 4/2012 | Jang et al. |
| 2012/0099476 A1 | 4/2012 | Mahaffy et al. |
| 2012/0115420 A1 | 5/2012 | Trainin |
| 2012/0195397 A1 | 8/2012 | Sayana et al. |
| 2012/0213162 A1 | 8/2012 | Koo et al. |
| 2012/0213208 A1 | 8/2012 | Hsu et al. |
| 2012/0244805 A1 | 9/2012 | Haikonen et al. |
| 2012/0276938 A1 | 11/2012 | Wagholikar et al. |
| 2012/0294396 A1 | 11/2012 | Desai |
| 2012/0327779 A1 | 12/2012 | Gell et al. |
| 2013/0045687 A1 | 2/2013 | Banerjea |
| 2013/0045688 A1 | 2/2013 | Banerjea |
| 2013/0057344 A1 | 3/2013 | Touzard et al. |
| 2013/0114548 A1 | 5/2013 | Banerjea |
| 2013/0130684 A1 | 5/2013 | Gomes et al. |
| 2013/0176903 A1 | 7/2013 | Bijwe |
| 2013/0225068 A1 | 8/2013 | Kiminki et al. |
| 2013/0287043 A1 | 10/2013 | Nanda et al. |
| 2014/0003318 A1 | 1/2014 | Desai |
| 2014/0004794 A1 | 1/2014 | Contaldo et al. |

(56) References Cited

U.S. PATENT DOCUMENTS

| 2014/0043966 | A1 | 2/2014 | Lee et al. |
| 2014/0044106 | A1 | 2/2014 | Bhagwat |
| 2014/0073251 | A1 | 3/2014 | Banerjea |

FOREIGN PATENT DOCUMENTS

| EP | 2299642 | 3/2011 |
| EP | 2456275 | 5/2012 |
| JP | 2006174162 | 6/2006 |
| JP | 200728568 | 2/2007 |
| JP | 2007028568 | 2/2007 |
| WO | WO-0178252 | 10/2001 |
| WO | WO-02082751 | 10/2002 |
| WO | WO-02091623 | 11/2002 |
| WO | WO-2006043956 | 4/2006 |
| WO | WO-2006090254 | 8/2006 |
| WO | WO-2007008981 | 1/2007 |
| WO | WO-2007064822 | 6/2007 |
| WO | WO-2008707777 | 6/2008 |
| WO | WO-2008150122 | 12/2008 |
| WO | WO-2009101567 | 8/2009 |
| WO | WO-2011056878 | 5/2011 |
| WO | WO-2013104989 | 7/2013 |
| WO | WO-2013119810 | 8/2013 |

OTHER PUBLICATIONS

"Advisory Action", U.S. Appl. No. 12/190,251, Dec. 7, 2011, 3 pages.
"Advisory Action", U.S. Appl. No. 12/646,721, Aug. 13, 2013, 3 pages.
"Draft Standard for Information Technology—Telecommunications and information exchange between systems—Local and metropolitan area networks—Specific requirements", IEEE P802.11s/D1.03, Apr. 2007, 251 pages.
"Final Office Action", U.S. Appl. No. 12/186,429, Oct. 13, 2011, 23 pages.
"Final Office Action", U.S. Appl. No. 12/190,251, Sep. 13, 2011, 15 pages.
"Final Office Action", U.S. Appl. No. 12/323,292, Aug. 24, 2012, 26 pages.
"Final Office Action", U.S. Appl. No. 12/358,955, Feb. 17, 2012, 26 pages.
"Final Office Action", U.S. Appl. No. 12/358,955, Mar. 18, 2013, 12 pages.
"Final Office Action", U.S. Appl. No. 12/484,563, Apr. 24, 2012, 18 pages.
"Final Office Action", U.S. Appl. No. 12/487,425, May 3, 2012, 9 pages.
"Final Office Action", U.S. Appl. No. 12/534,361, Feb. 29, 2012, 13 pages.
"Final Office Action", U.S. Appl. No. 12/542,845, Sep. 25, 2012, 23 pages.
"Final Office Action", U.S. Appl. No. 12/616,454, Apr. 11, 2012, 19 pages.
"Final Office Action", U.S. Appl. No. 12/646,721, Jun. 6, 2013, 16 pages.
"Final Office Action", U.S. Appl. No. 12/646,802, Nov. 15, 2012, 15 pages.
"Final Office Action", U.S. Appl. No. 12/759,336, Feb. 25, 2013, 11 pages.
"Foreign Office Action", CN Application No. 200980122587.0, Sep. 10, 2013, 11 Pages.
"Foreign Notice of Allowance", Japanese Application No. 2011-513586, Jul. 16, 2013, 2 pages.
"Foreign Office Action", CN Application No. 200980122587.0, Feb. 21, 2013, 17 pages.
"Foreign Office Action", EP Application No. 09789754.0, May 17, 2011, 8 pages.
"Foreign Office Action", European Patent Application No. 09789754.0, Mar. 11, 2013, 4 Pages.
"Foreign Office Action", European Patent Application No. 09789754.0, Jul. 12, 2012, 4 pages.
"Foreign Office Action", Japanese Application No. 2011-513586, Apr. 9, 2013, 4 Pages.
"Foreign Office Action", Japanese Application No. 2011-513586, Oct. 23, 2012, 7 pages.
"Further Higher Data Rate Extension in the 2.4 GHz Band", IEEE P802.11g/D8.2, DRAFT Supplement to Standard [for] Information Technology, Apr. 2003, 69 pages.
"IEEE Standard for Information Technology—Telecommunications and information exchange between systems—Local and metropolitan area networks—Specific requirements Part 11: Wireless LAN Medium Access Control (MAC) and Physical Layer (PHY) specifications Amendment", IEEE Computer Society, Oct. 14, 2010, pp. 12-18, 23, 65-68.
"Information Technology—Telecommunications and Information Exchange Between systems—Local and Metropolitan Area Networks—Specific Requirements", IEEE Standard, Aug. 1, 2005, pp. 1-60.
"Information Technology—Telecommunications and Information Exchange between Systems—Local and Metropolitan Area Networks—Specific Requirements", Part 11: Wireless LAN Medium Access Control (MAC) and Physical Layer (PHY) Specifications, IEEE Standard 802.11h-2003 (Amendment to IEEE Std 802.11-1993), Oct. 14, 2003, 80 pages.
"International Search Report and Written Opinion", Application No. PCT/US2012/035597, Aug. 6, 2012, 13 pages.
"International Search Report and Written Opinion", Application No. PCT/US2009/046289, Oct. 29, 2009, 13 pages.
"International Search Report and Written Opinion", Application No. PCT/IB2013/001962, Feb. 6, 2014, 11 Pages.
"Non-Final Office Action", U.S. Appl. No. 13/429,090, Oct. 24, 2013, 13 pages.
"Non-Final Office Action", U.S. Appl. No. 12/167,841, Jul. 15, 2011, 10 pages.
"Non-Final Office Action", U.S. Appl. No. 12/186,429, Apr. 25, 2011, 19 pages.
"Non-Final Office Action", U.S. Appl. No. 12/190,240, Jan. 6, 2012, 7 pages.
"Non-Final Office Action", U.S. Appl. No. 12/190,251, Mar. 29, 2012, 11 pages.
"Non-Final Office Action", U.S. Appl. No. 12/190,251, Mar. 29, 2011, 8 pages.
"Non-Final Office Action", U.S. Appl. No. 12/235,333, Jun. 28, 2011, 16 pages.
"Non-Final Office Action", U.S. Appl. No. 12/323,292, Dec. 21, 2011, 17 pages.
"Non-Final Office Action", U.S. Appl. No. 12/358,955, Sep. 6, 2011, 24 pages.
"Non-Final Office Action", U.S. Appl. No. 12/358,955, Aug. 20, 2012, 33 pages.
"Non-Final Office Action", U.S. Appl. No. 12/478,446, Dec. 28, 2011, 17 pages.
"Non-Final Office Action", U.S. Appl. No. 12/484,563, Oct. 4, 2011, 13 pages.
"Non-Final Office Action", U.S. Appl. No. 12/487,425, Jan. 12, 2012, 7 pages.
"Non-Final Office Action", U.S. Appl. No. 12/534,361, Oct. 12, 2011, 11 pages.
"Non-Final Office Action", U.S. Appl. No. 12/542,845, Oct. 23, 2013, 29 pages.
"Non-Final Office Action", U.S. Appl. No. 12/542,845, Apr. 4, 2012, 19 pages.
"Non-Final Office Action", U.S. Appl. No. 12/616,454, Dec. 22, 2011, 8 pages.
"Non-Final Office Action", U.S. Appl. No. 12/646,721, Nov. 7, 2012, 15 pages.
"Non-Final Office Action", U.S. Appl. No. 12/646,721, May 10, 2012, 15 pages.
"Non-Final Office Action", U.S. Appl. No. 12/646,802, Mar. 29, 2012, 16 pages.
"Non-Final Office Action", U.S. Appl. No. 12/732,036, Aug. 9, 2012, 13 pages.

(56) References Cited

OTHER PUBLICATIONS

"Non-Final Office Action", U.S. Appl. No. 12/759,336, Oct. 4, 2012, 13 pages.
"Non-Final Office Action", U.S. Appl. No. 12/883,054, Nov. 22, 2013, 18 pages.
"Non-Final Office Action", U.S. Appl. No. 13/099,169, Mar. 28, 2013, 12 pages.
"Non-Final Office Action", U.S. Appl. No. 13/099,169, Oct. 4, 2013, 9 pages.
"Non-Final Office Action", U.S. Appl. No. 13/249,740, Mar. 26, 2013, 9 pages.
"Non-Final Office Action", U.S. Appl. No. 13/249,740, Oct. 16, 2013, 9 pages.
"Non-Final Office Action", U.S. Appl. No. 13/479,124, Sep. 27, 2013, 14 pages.
"Non-Final Office Action", U.S. Appl. No. 13/604,563, Apr. 5, 2013, 6 pages.
"Non-Final Office Action", U.S. Appl. No. 13/656,482, Mar. 19, 2013, 19 pages.
"Non-Final Office Action", U.S. Appl. No. 13/656,502, Feb. 21, 2013, 6 pages.
"Non-Final Office Action", U.S. Appl. No. 13/757,276, Jan. 30, 2014, 9 pages.
"Non-Final Office Action", U.S. Appl. No. 13/911,979, Jan. 31, 2014, 19 pages.
"Notice of Allowance", U.S. Appl. No. 12/167,841, Nov. 25, 2011, 11 pages.
"Notice of Allowance", U.S. Appl. No. 12/186,429, Jun. 6, 2013, 9 pages.
"Notice of Allowance", U.S. Appl. No. 12/190,240, May 16, 2012, 4 pages.
"Notice of Allowance", U.S. Appl. No. 12/190,251, Oct. 4, 2012, 6 pages.
"Notice of Allowance", U.S. Appl. No. 12/235,333, Nov. 15, 2011, 5 pages.
"Notice of Allowance", U.S. Appl. No. 12/323,292, Jun. 28, 2013, 8 pages.
"Notice of Allowance", U.S. Appl. No. 12/358,955, Jul. 1, 2013, 8 pages.
"Notice of Allowance", U.S. Appl. No. 12/478,446, Jun. 14, 2012, 6 pages.
"Notice of Allowance", U.S. Appl. No. 12/484,563, Jul. 9, 2012, 6 pages.
"Notice of Allowance", U.S. Appl. No. 12/487,425, Jul. 26, 2013, 9 pages.
"Notice of Allowance", U.S. Appl. No. 12/534,361, Feb. 14, 2013, 12 pages.
"Notice of Allowance", U.S. Appl. No. 12/616,454, Aug. 22, 2012, 4 pages.
"Notice of Allowance", U.S. Appl. No. 12/716,569, Apr. 19, 2012, 7 pages.
"Notice of Allowance", U.S. Appl. No. 12/732,036, Feb. 21, 2013, 8 pages.
"Notice of Allowance", U.S. Appl. No. 12/759,336, May 3, 2013, 9 pages.
"Notice of Allowance", U.S. Appl. No. 13/604,563, Sep. 26, 2013, 5 pages.
"Notice of Allowance", U.S. Appl. No. 13/656,482, Sep. 3, 2013, 8 pages.
"Notice of Allowance", U.S. Appl. No. 13/656,502, Jun. 25, 2013, 11 pages.
"Part 11: Wireless LAN Medium Access Control (MAC) and Physical Layer (PHY) specifications", IEEE Std 802.11b-1999/Cor 1-2001, Amendment 2: Higher-speed Physical Layer (PHY) extension in the 2.4 GHz band, Nov. 7, 2001, 23 pages.
"Part 11: Wireless LAN Medium Access Control (MAC) and Physical Layer (PHY) specifications", IEEE Std 802.11a-1999, High-speed Physical Layer in the 5 GHz Band, 1999, 91 pages.
"Part 11: Wireless LAN Medium Access Control (MAC) and Physical Layer (PHY) specifications", Information technology—Telecommunications and information exchange between systems—Local and metropolitan area networks—Specific requirements—, IEEE, Apr. 2003, pp. 1-69.
"PCT Search Report and Written Opinion", Application No. PCT/IB2013/000390, Aug. 21, 2013, 19 Pages.
"PCT Search Report and Written Opinion", Application No. PCT/US2013/025144, Jun. 5, 2013, 10 pages.
"PCT Search Report and Written Opinion", Application No. PCT/US2011/054358, Dec. 16, 2011, 13 pages.
"Restriction Requirement", U.S. Appl. No. 12/167,841, Aug. 12, 2011, 6 pages.
"Search Report", European Application No. 13169350.9, Aug. 13, 2013, 10 Pages.
"Supplemental Notice of Allowance", U.S. Appl. No. 12/186,429, Jul. 10, 2013, 2 pages.
"Supplemental Notice of Allowance", U.S. Appl. No. 12/323,292, Oct. 17, 2013, 2 pages.
"Supplemental Notice of Allowance", U.S. Appl. No. 12/323,292, Oct. 7, 2013, 2 pages.
"Supplemental Notice of Allowance", U.S. Appl. No. 12/358,955, Oct. 11, 2013, 3 pages.
"Supplemental Notice of Allowance", U.S. Appl. No. 12/716,569, Jul. 23, 2012, 2 pages.
"Supplemental Notice of Allowance", U.S. Appl. No. 12/759,336, Jun. 5, 2013, 2 pages.
"Supplemental Notice of Allowance", U.S. Appl. No. 12/759,336, Jun. 18, 2013, 2 pages.
"Supplemental Notice of Allowance", U.S. Appl. No. 12/759,336, Aug. 14, 2013, 2 pages.
"Supplemental Notice of Allowance", U.S. Appl. No. 13/656,482, Nov. 29, 2013, 2 pages.
"Supplemental Notice of Allowance", U.S. Appl. No. 13/656,482, Dec. 19, 2013, 2 pages.
Haas, et al., "Gossip-Based Ad Hoc Routing", IEEE/ACM Transactions on Networking, vol. 14, No. 3, Jun. 2006, pp. 479-491.
Jung, et al., "A Power Control MAC Protocol for Ad Hoc Networks", Wireless Networks; The Journal of Mobile Communication, Computation and Information, Kluwer Academic Publishers vol. 11, No. 1-2, Jan. 1, 2005, 12 Pages.
Jung, et al., "A Power Control MAC Protocol for Ad Hoc Networks", In Proceedings of MOBICOM 2002, Sep. 23, 2002, pp. 36-47.
Mazzanti, et al., "Analysis and Design of Injection-Locked LC Dividers for Quadrature Generation", IEEE Journal of Solid-State Circuits, vol. 39, No. 9, Sep. 2004, pp. 1425-1433.
Mujtaba, "TGn Sync Proposal Technical Specification", IEEE 802.11-04/0889r6, This document presents the technical specification for the MAC and the PHY layer of the TGn Sync proposal to IEEE 802.11 TGn, May 18, 2005, pp. 1-131.
Qiao, et al., "Interference Analysis and Transmit Power Control in IEEE 802.11a/h Wireless LANs", IEEE/ACM Transactions on Networking, IEEE/ACM, New York, NY, US, vol. 15. No. 5, Oct. 1, 2007, 14 Pages.
Tinnirello, et al.,' "Revisit of RTS / CTS Exchange in High-Speed IEEE 802.11 Networks", World of Wireless Mobile and Multimedia Networks. 2005. Wowmom 2005. Sixth IEEE International Symposium on a Taormina-Giardini Naxos, Italy Jun. 13-16, 2005 Piscataway, NJ, USA,IEEE, Los Alamitos, CA, USA, Jun. 13, 2005, 10 Pages.
"Final Office Action", U.S. Appl. No. 12/883,054, Jun. 9, 2014, 22 pages.
"Non-Final Office Action", U.S. Appl. No. 13/458,227, Jul. 3, 2014, 10 pages.
"Non-Final Office Action", U.S. Appl. No. 13/911,979, Jun. 9, 2014, 11 pages.
"Non-Final Office Action", U.S. Appl. No. 14/082,981, Aug. 4, 2014, 6 pages.
"Notice of Allowance", U.S. Appl. No. 13/757,276, Jul. 8, 2014, 6 pages.
"Non-Final Office Action", U.S. Appl. No. 13/536,506, Apr. 25, 2014, 12 pages.
"Non-Final Office Action", U.S. Appl. No. 12/883,054, Sep. 11, 2014, 29 pages.

(56) References Cited

OTHER PUBLICATIONS

"Non-Final Office Action", U.S. Appl. No. 13/622,916, Sep. 10, 2014, 10 pages.

"Non-Final Office Action", U.S. Appl. No. 14/063,972, Sep. 24, 2014, 6 pages.

"Notice of Allowance", U.S. Appl. No. 13/536,506, Sep. 19, 2014, 7 pages.

"Notice of Allowance", U.S. Appl. No. 14/063,972, Nov. 7, 2014, 8 pages.

"Supplemental Notice of Allowance", U.S. Appl. No. 13/757,276, Oct. 24, 2014, 2 pages.

CIRCUIT AND METHOD FOR ADJUSTING A DIGITALLY CONTROLLED OSCILLATOR

RELATED APPLICATION

This application is a continuation of and claims priority to U.S. Utility application Ser. No. 12/487,425 filed Jun. 18, 2009, which claims priority to U.S. Provisional Patent Application Ser. No. 61/076,461 filed Jun. 27, 2008, of which the disclosures are incorporated by reference herein in their entirety.

BACKGROUND

The present invention relates to digital circuits, and in particular, to a circuit and method for adjusting a digitally controlled oscillator.

Figure 1:
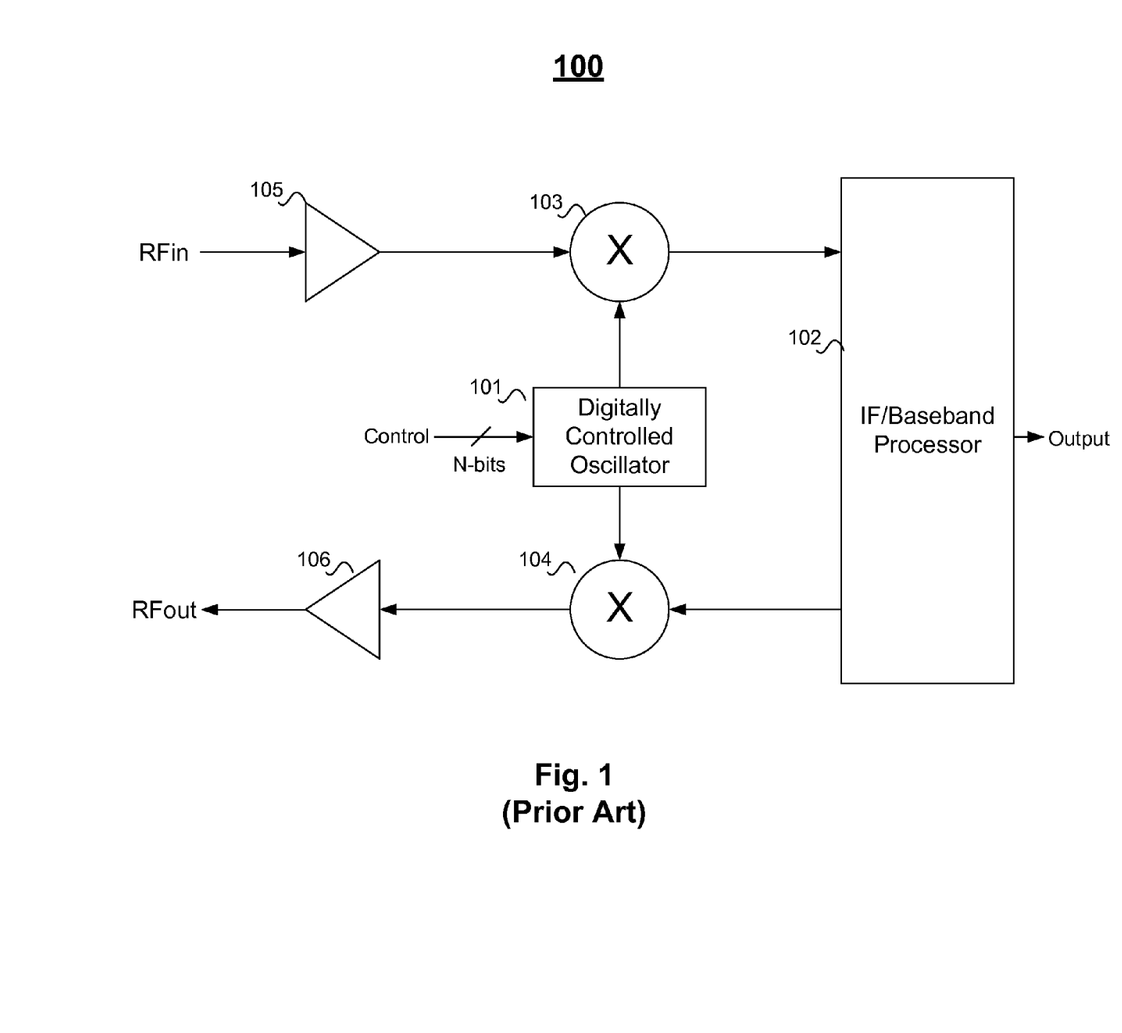
FIG. 1 illustrates a conventional communication system that uses a digitally controlled oscillator to provide a carrier signal for a receiver mixer and a transmitter mixer.

FIG. 1 illustrates a communication system 100 that uses digitally controlled oscillator (DCO) 101 to provide a carrier signal for a receiver mixer 103 and a transmitter mixer 104. An input radio frequency (RF) signal RFin is amplified by amplifier 105, demodulated by receiver mixer 103, and processed by inter-frequency (IF)/baseband processor 102. IF/baseband processor 102 also provides a signal that transmitter mixer 104 modulates, and amplifier 106 amplifies to produce RF signal RFout.

DCO 101 receives a control signal of N-bits and may provide a carrier signal having a frequency $f_1$ to receiver mixer 103 and to transmitter mixer 104. DCO 101 uses the digital control signal (N-bits) to adjust the frequency $f_1$.

When the frequency $f_1$ drifts or may otherwise require adjustment, the DCO 101 may be adjusted to provide a carrier signal having a new frequency and/or frequency adjustment. DCO control bits adjust the frequency of the DCO 101 in discrete steps and a minimum step of frequency may represent the smallest change of frequency $f_1$.

The minimum step may be limited by the minimum capacitor values which may be switched internal to DCO 101. The minimum step may cause a disruption, such as glitches, in the processing of the signal within IF/baseband processor 102 or in a subsequent stage. For example, in FM (frequency modulation) demodulation of an audio signal, these glitches may cause clicking sounds from a speaker.

Figure 2:
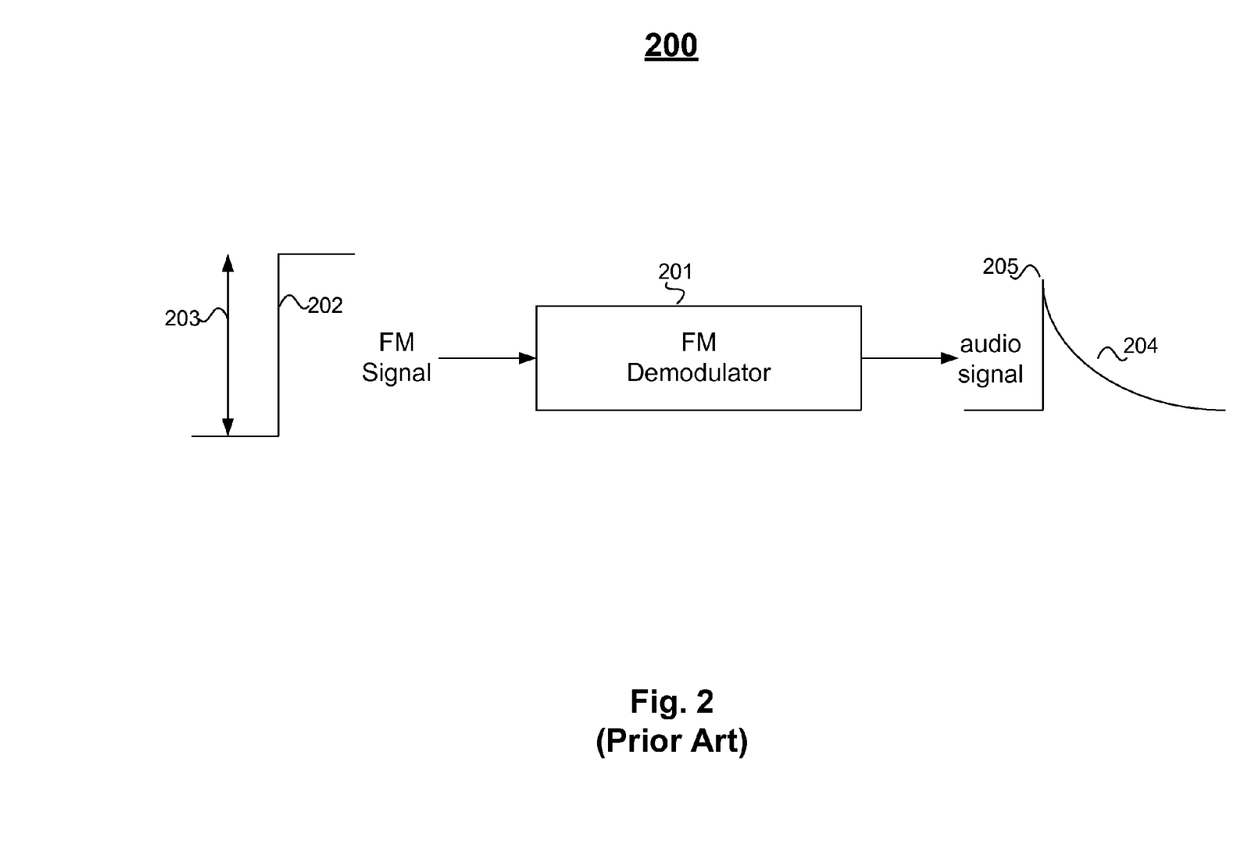
FIG. 2 illustrates the effect of a frequency change on an audio signal.

FIG. 2 illustrates the effect of a frequency change 202 on an audio signal 204. FM demodulator 201 receives a FM signal which includes a frequency change 202 over a step 203. This frequency step 203 may create an audio DC step after demodulation, which causes a glitch 205 in the audio signal 204. Glitch 205 may cause audible clicks to the user. If the frequency is recalibrated periodically, it may create undesirable audible tones.

SUMMARY OF THE INVENTION

Embodiments of the present invention improve digital frequency adjustment. In one embodiment, the present invention includes a method of generating an oscillating signal at different frequencies, the method comprising configuring a digitally controlled oscillator to generate the oscillating signal at a first frequency, and configuring the digitally controlled oscillator to transition from the first frequency to a second frequency during a transition time period, the second frequency being different than the first frequency. During the transition time period, the digitally controlled oscillator activates the second frequency and deactivates the first frequency during a plurality of time intervals. The time intervals for activating the second frequency and deactivating the first frequency successively increase from a beginning of the transition time period to an end of the transition time period.

In one embodiment, the time intervals are increased based on a linear ramp.

In one embodiment, the time intervals are generated in response to a pulse width modulated signal.

In one embodiment, the method further comprises generating a transition signal and converting the transition signal into a bit stream to configure the digitally controlled oscillator to activate and deactivate the first frequency and the second frequency.

In one embodiment, the transition signal is a digital signal that successively increases from a first value to a second value.

In one embodiment, converting the transition signal into a bit stream comprises processing the digital signal in a sigma-delta modulator.

In one embodiment, configuring the digitally controlled oscillator to transition includes generating a bit stream, wherein the bit stream comprises pulse width modulated data corresponding to a transition signal, and wherein a selection between a first code corresponding to the first frequency and a second code corresponding to the second frequency is responsive to the bit stream.

In one embodiment, the present invention includes an electronic circuit comprising a digital controlled oscillator for generating an oscillating signal and a transition controller coupled to the digitally controlled oscillator. The transition controller configures the digitally controlled oscillator to generate the oscillating signal at a first frequency and transitions the oscillating signal from the first frequency to a second frequency during a transition time period, where the second frequency is different than the first frequency. During the transition time period, the digitally controlled oscillator activates the second frequency and deactivates the first frequency during a plurality of time intervals, where the time intervals for activating the second frequency and deactivating the first frequency successively increase from a beginning of the transition time period to an end of the transition time period.

In one embodiment, the transition controller includes a digital signal generator to provide a linear ramp to increase the time intervals.

In one embodiment, the transition controller includes a modulator to provide a pulse width modulated signal, where the time intervals are generated in response to the pulse width modulated signal.

In one embodiment, the transition controller comprises a digital signal generator to provide a transition signal and a converter to convert the transition signal into a bit stream to configure the digitally controlled oscillator to activate and deactivate the first frequency and the second frequency.

In one embodiment, the converter is a sigma delta modulator to convert the transition signal into a bit stream.

In one embodiment, the transition signal is a digital signal that successively increases from a first value to a second value.

In one embodiment, the transition controller generates a bit stream to configure the digitally controlled oscillator to transition, where the bit stream comprises pulse width modulated data corresponding to a transition signal, and a selection between a first code corresponding to the first frequency and a second code corresponding to the second frequency is responsive to the bit stream.

In one embodiment, the present invention includes a communication system comprising an amplifier to amplify a radio frequency signal, a mixer to demodulate the radio frequency signal, a digital controlled oscillator to provide an oscillating signal to the mixer, and a transition controller coupled to the digitally controlled oscillator. The transition controller configures the digitally controlled oscillator to generate the oscillating signal at a first frequency and transitions the oscillating signal from the first frequency to the second frequency during a transition time period, the second frequency being different than the first frequency, wherein during the transition time period, the digitally controlled oscillator activates the second frequency and deactivates the first frequency during a plurality of time intervals, and wherein the time intervals for activating the second frequency and deactivating the first frequency successively increase from a beginning of the transition time period to an end of the transition time period.

The following detailed description and accompanying drawings provide a detailed description of the present invention.

DETAILED DESCRIPTION

Described herein are techniques for adjusting a digitally controlled oscillator. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 3A:
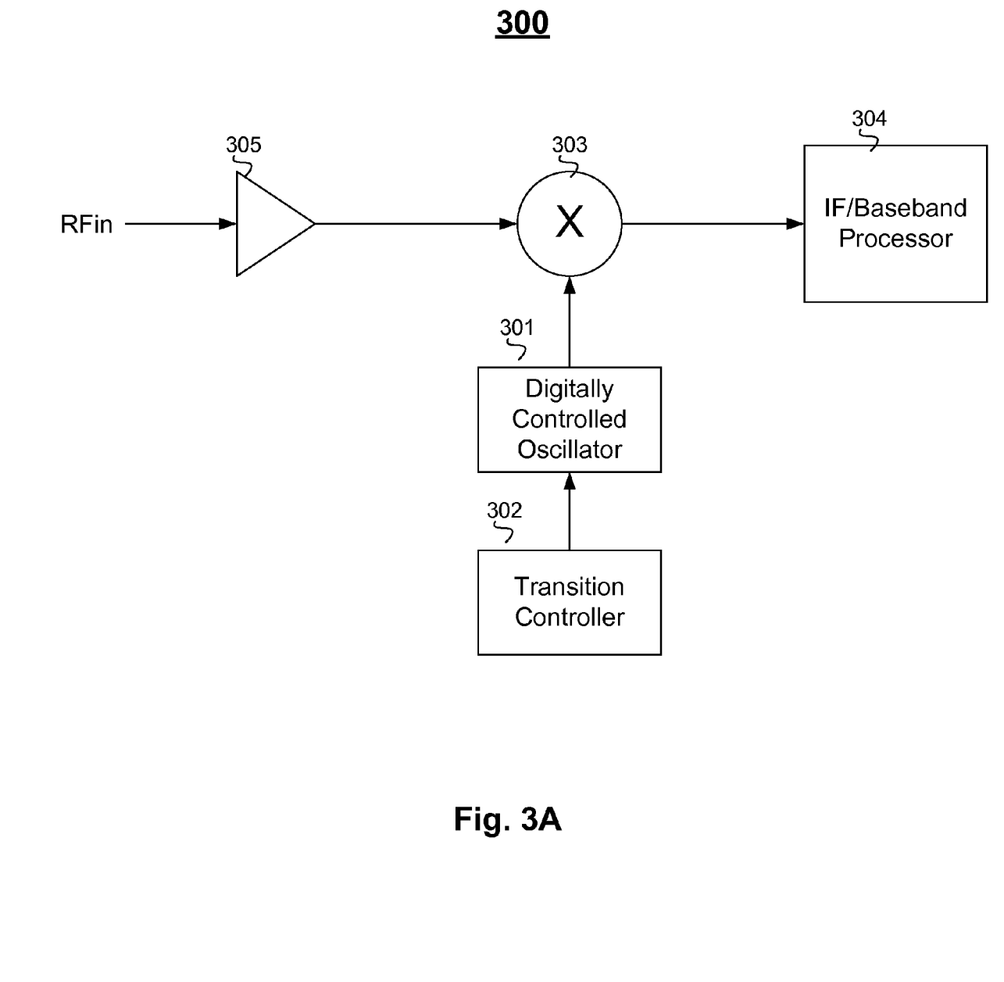
FIG. 3A illustrates a RF communication system.

FIG. 3A illustrates a RF communication system 300. RF communication system 300 includes amplifier 305, mixer 303, IF/baseband processor 304, digitally controlled oscillator (DCO) 301, and transition controller 302. Amplifier 305 receives and amplifies signal RFin (e.g., from an antenna). Mixer 303 demodulates RFin by using an oscillating signal from digitally controlled oscillator 301. The demodulated signal from mixer 303 is received and processed by IF/baseband processor 304. Transition controller 302 generates a digital signal to configure digitally controlled oscillator 301. The digitally controlled oscillator 301 may be configured to generate signals at different frequencies and may be configured to transition from a signal having one frequency to a signal having another frequency.

Figure 3B:
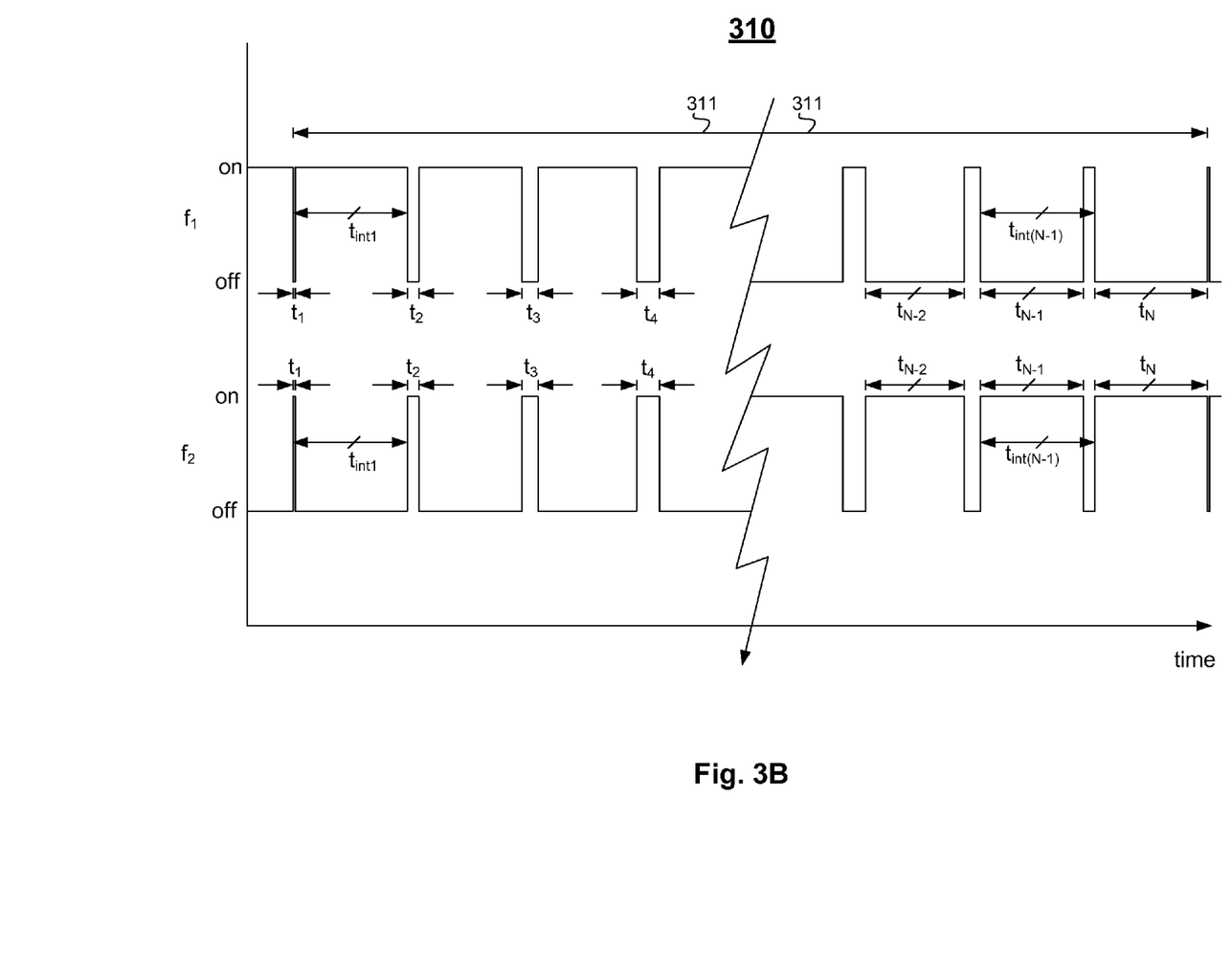
FIG. 3B illustrates a timing diagram 310 associated with the communication system of FIG. 3A.

FIG. 3B illustrates an example timing diagram 310 associated with the communication system 300 of FIG. 3A. Timing diagram 300 includes waveform f1 showing the activation/deactivation of a first frequency, and waveform f2 showing the activation/deactivation of a second frequency. Before transition period 311, DCO 301 of FIG. 3A may be configured to generate the oscillating signal at a first frequency. After transition period 311, DCO 301 may be configured to generate the oscillating signal at a second frequency.

As shown in the timing diagram 310, the first frequency is deactivated and the second frequency is activated for time intervals t1, t2, t3, . . . , tN-2, tN-1, tN. The time intervals successively increase from the beginning of transition period 311 to the end of the transition period 311. For example, during time interval t1, the transition controller may deactivate the first frequency (i.e., the frequency of the signal before the transition) and activate the second frequency (i.e., the frequency of the signal after the transition). Initially, the time interval when the first frequency is deactivated and the second frequency is activated is small. Accordingly, the average frequency is approximately the first frequency. However, as the transition period 311 progresses, the time intervals increase. Accordingly, toward the end of the transition period 311, the time interval when the first frequency is deactivated and the second frequency is activated is large. Accordingly, the average frequency is approximately the second frequency. Features and advantages of the present invention include transitioning from one frequency to another by successively increasing the time intervals as described above, thereby resulting in a smoother frequency transition than would be obtained with a step increase between the two frequencies. The intervals may increase according to a variety of techniques. In one embodiment, the intervals may be increased based on a transition signal such as a linear ramp, for example. As described below, different transition signals may be used. In one embodiment, the time period from the beginning one time interval to the beginning of the next time interval may be constant across the entire transition period, as in some pulse code modulated systems (e.g., tint1 may be the same as time period tint(N−1)). Therefore, the time intervals (e.g. t1, t2, etc. . . . ) may correspond to transition signal which has been pulse width modulated as described in more detail below.

Figure 3C:
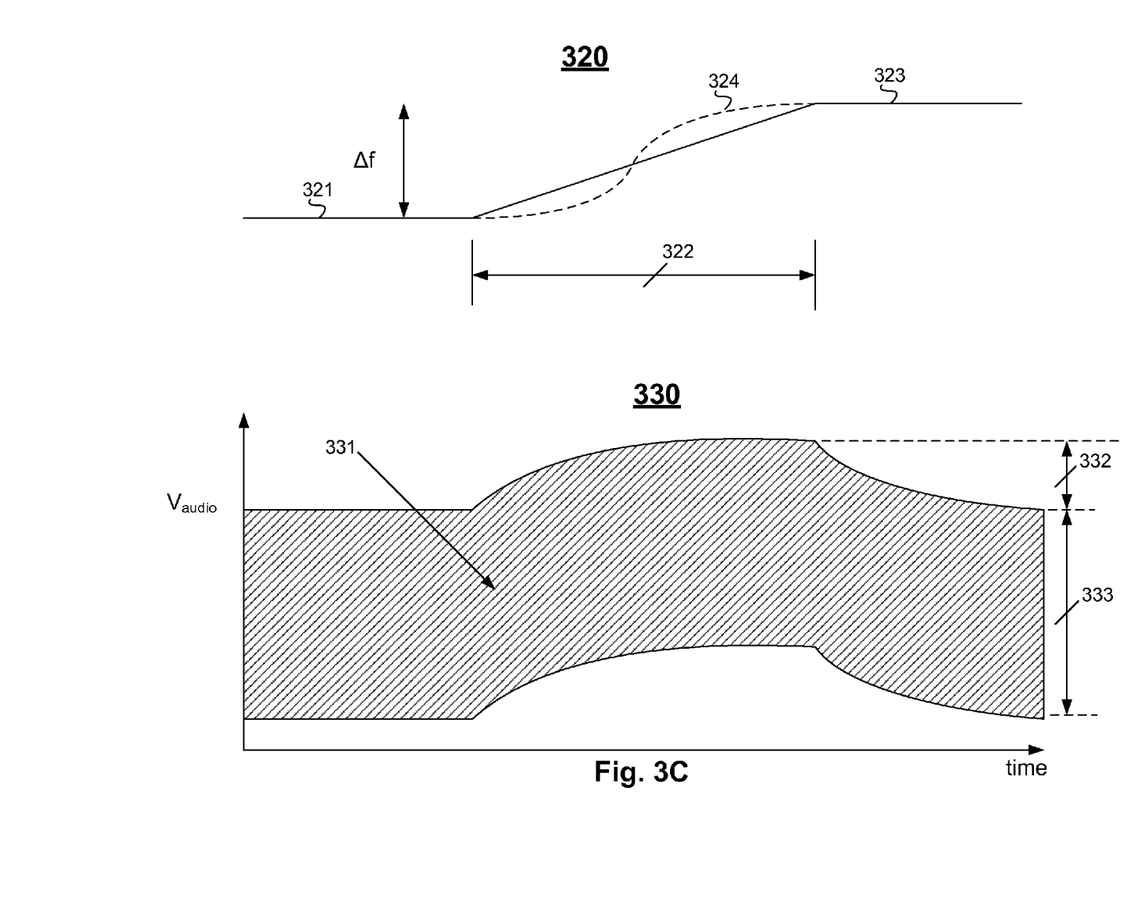
FIG. 3C illustrates a transition signal waveform and a corresponding audio signal waveform associated with the communication system of FIG. 3A.

FIG. 3C illustrates an example transition signal waveform 320 and a corresponding audio signal waveform 330 associated with the communication system of FIG. 3A. In the example of FIG. 3C, transition signal waveform 320 is a linear ramp. Level 321 may correspond to a first frequency and level 323 may correspond to a second frequency. During transition period 322, transition signal waveform 320 increases from level 321 to level 323. Audio signal waveform 330 indicates the effect of a change in frequency on an audio signal envelope 333 after FM demodulation. The deviation of the signal illustrated by 332 is significantly reduced by using the frequency transition techniques described herein as compared with a step frequency change. In comparison with prior art techniques illustrated at 204 and 205 in FIG. 2, the audio signal change is smoother and not as abrupt, which reduces audible noise resulting from the transition. While the above transition signal illustrates an increasing transitional waveform, it is to be understood that other embodiments of the present invention may use a transition scheme using successively decreasing time intervals and decreasing transition signals. The examples provided in this specification for increasing time intervals and increasing transitions signals are, therefore, only exemplary.

Portion 331 indicates approximately where audio signal waveform 330 is perturbed by the transition signal waveform 320, and audio signal waveform 330 moves an additional amount 332. The amount of perturbation of the audio signal waveform 330 may be further reduced by altering the transition signal waveform 320 as indicated by alternative transition signal waveform 324 (shown by dashed line). Alternative transition signal waveform 324 may be associated with a higher order equation such as arctangent, for example. The time intervals of FIG. 3B may be increased successively based on the linear ramp, arctangent, or other monotonically increasing signal used for the transition signal waveform 320.

Figure 4:
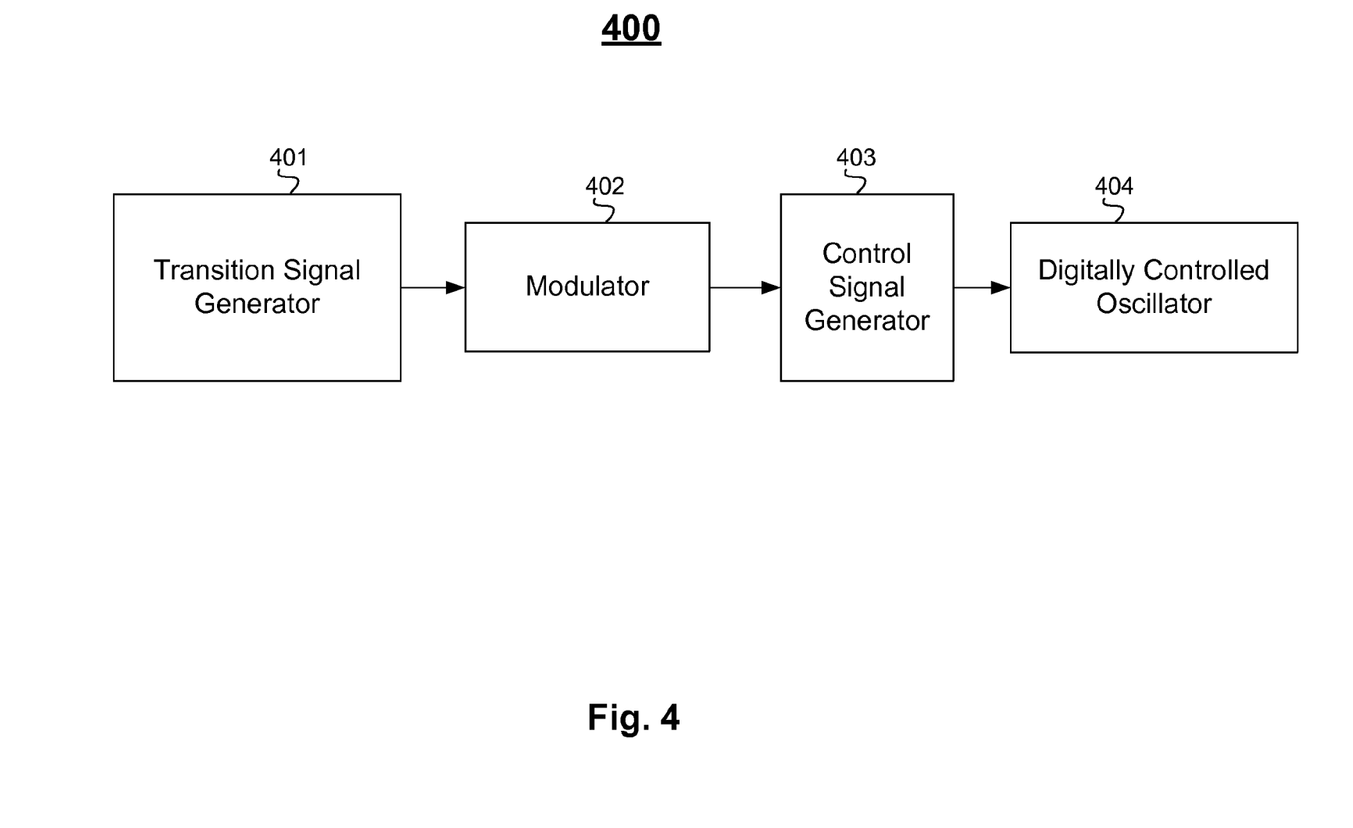
FIG. 4 illustrates an electronic circuit for generating an oscillating signal.

FIG. 4 illustrates an example electronic circuit 400 for generating an oscillating signal. Electronic circuit 400 includes transition signal generator 401, modulator 402, control signal generator 403, and DCO 404. Control signal generator 403 may generate control signals, such as digital control signals, to configure DCO 404 to generate an oscillating signal at a first frequency. Also, control signal generator 403 may generate control signals to configure DCO 404 to generate an oscillating signal at a second frequency. The control signal generator 403 may receive inputs from the transition signal generator 401 and modulator 402 to configure DCO 404 to transition from the first frequency to the second frequency.

Transition signal generator 401 generates transition signals. For example, the transition signal may be a linear ramp, an arctangent, or a combination of mathematical equations that produce a smooth transition from a first level to a second level. The transition signal generator 401 may generate a digital signal corresponding to a continuous transitional waveform. The transition signal may be a digital signal that successively increases from a first initial value to a second final value with a plurality of intermediate values. In this case, the first value may correspond to a first frequency and the second value may correspond to a second frequency. In one embodiment, the transition signal generator 401 is a counter, for example.

Modulator 402 modulates the transition signal provided by transition signal generator 401. Modulator 402 may be a pulse width modulator (PWM) such as a sigma delta converter, for example. Modulator 402 may convert the transition signal into a bit stream to configure DCO 404 to activate and deactivate the first and second frequencies. The duration of the pulse widths may correspond to time intervals which activate/deactivate the first and second frequencies.

Control signal generator 403 receives the modulated signal from modulator 402 and provides control signals to configure DCO 404 to transition from one frequency to another frequency. Control signal generator 403 may provide a first control word to configure DCO 404 to a first frequency and a second control word to configure DCO 404 to a second frequency. The modulated transition signal may be used to select between the first control word and the second control word during a transition period. The modulated transition signal may provide a smooth transition between the first frequency and the second frequency.

Figure 5:
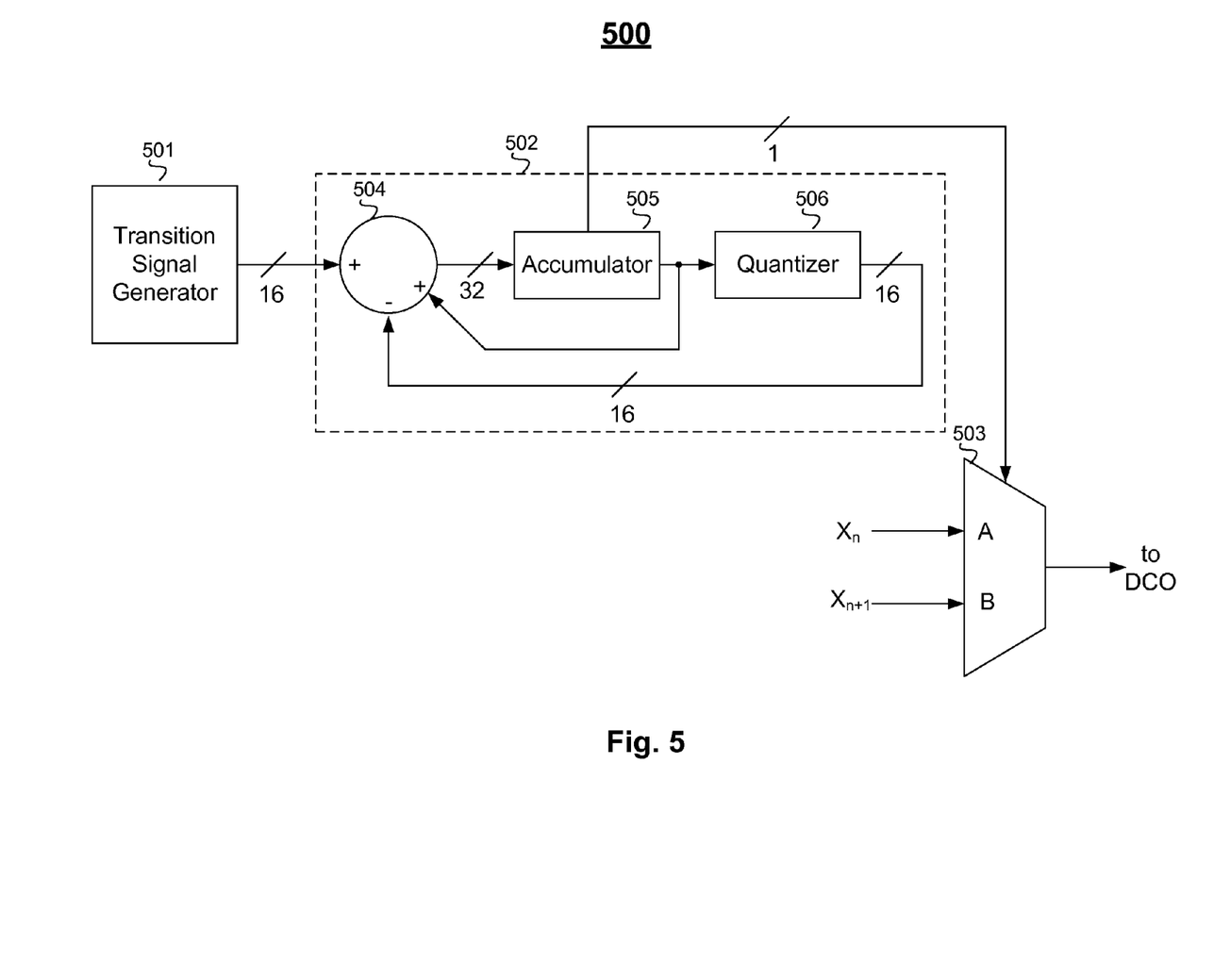
FIG. 5 illustrates an electronic circuit for generating an oscillating signal.

FIG. 5 illustrates an example electronic circuit 500 for generating an oscillating signal. Circuit 500 includes transition signal generator 501, modulator 502, and multiplexer 503. Transition signal generator 501 produces 16 bit words to modulator 502. Modulator 502 is a sigma delta converter in this embodiment and produces a bit stream from accumulator 502 that successively switches between a first control word Xn and a second control word Xn+1.

Transition signal generator 501 provides a digital signal. The duration of the transition period may be programmed such that the rate of the transition may be controlled. Modulator 502 modulates the digital signal from transition signal generator 501. Modulator 501 may be a first or higher order sigma delta converter. A summation node 504 receives the 16 bit transition signal, subtracts the 16 bit output of quantizer 506, and adds the result of accumulator 505. This produces a 32 bit error signal for the input of the accumulator 505. Accumulator 505 functions as a digital integrator to a 32 bit error signal from summation node 504. Accumulator 505 provides an integration of the error signal to quantizer 506. The accumulator 505 provides a sign bit output to multiplexer 503.

Modulator 502 converts the transition signal from transition signal generator 501 into a bit stream. The sign bit of accumulator 505 is a sigma-delta modulated bit stream of the transition signal. Multiplexer 503 may use this bit stream to select between control words associated with the change of frequency.

Multiplexer 503 selects between two control words at input A and input B. Control word Xn may correspond to a signal from DCO having a frequency fn and control word Xn+1 may correspond to a signal from DCO having frequency fn+1. The modulated signal from modulator 502 provides a pulse width modulated signal corresponding to a smooth transition between frequency fn and frequency fn+1.

Figure 6:
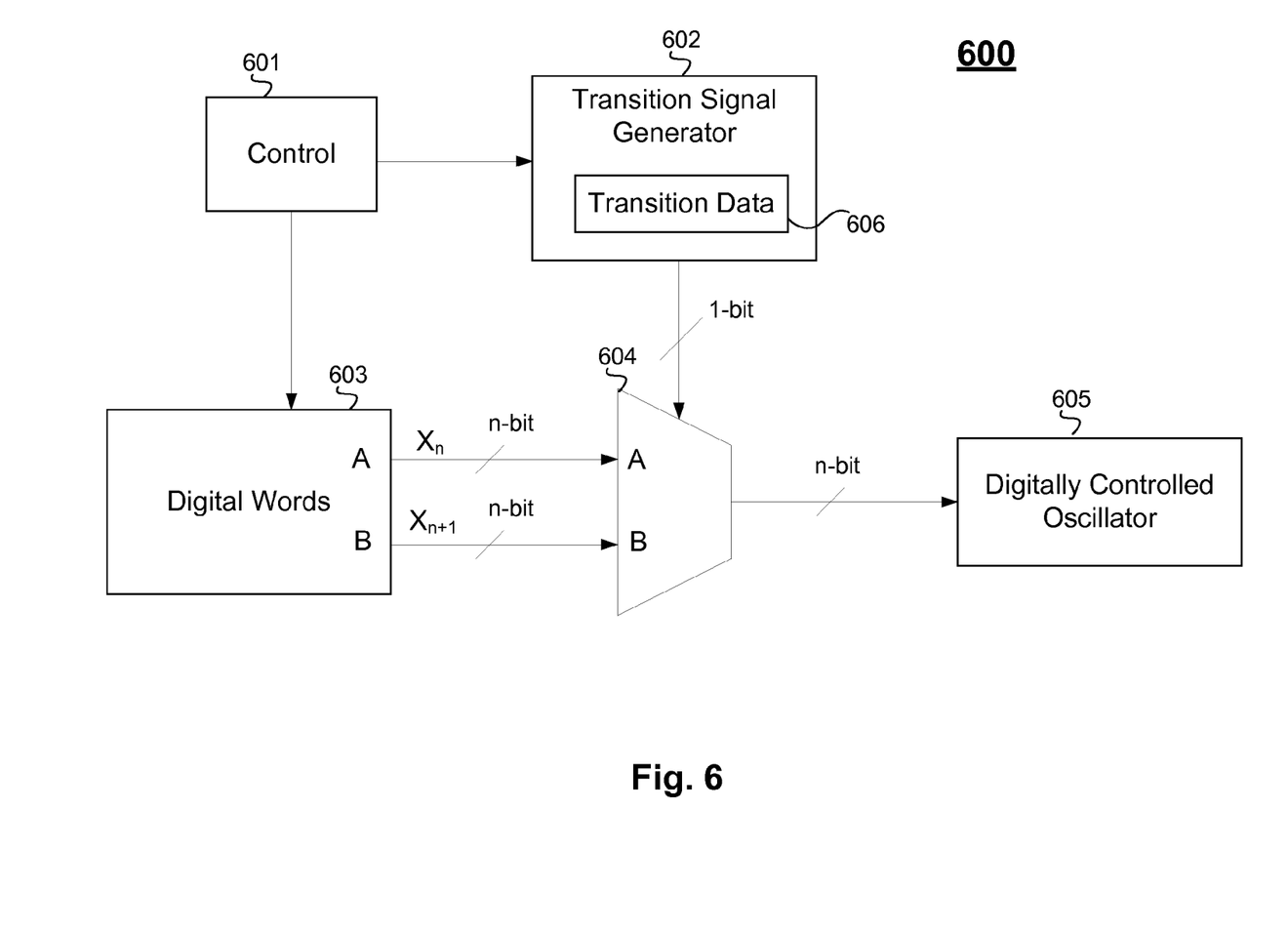
FIG. 6 illustrates an electronic circuit for generating an oscillating signal.

FIG. 6 illustrates an example electronic circuit 600 for generating an oscillating signal. Circuit 600 includes control circuit 601, transition signal generator 602, digital word generator 603, multiplexer 604, and DCO 605. Multiplexer 604 may be similar to multiplexer 503 of FIG. 5. Multiplexer 604 receives digital words from digital word generator 603. These words may be n bit, which corresponds to the output of multiplexer 604 and the DCO 605 circuitry used. For example, DCO 605 may have "n" switches which are used to configure the desired DCO frequency setting.

In one implementation, transition signal generator 602 generates a bit stream based on transition data 606. The transition data 606 may be predetermined to provide pulse width modulated data corresponding to a minimum frequency change. The transition data may include pulse width modulated data corresponding to an increasing (e.g., A to B) transitional waveform and a pulse width modulated data corresponding to a decreasing (B to A) transitional waveform (as described above). In one implementation, rather than generating the modulated data from a transition signal, the bit stream is stored in memory and provided to the multiplexer 604 when needed for a transition.

Control circuit 601 may determine the succession of digital words provided by digital word generator 603. For example, digital word generator 603 may also be a memory for storing digital words to be coupled to DCO 605 through multiplexer 604 as described above to transition between frequencies. Control circuit 601 may also determine the transition data 606 which may be used to transition between the digital word provided at input A of multiplexer 604 and the digital word provided at input B of multiplexer 604. The transition signal generator 602 uses transition data 606 to provide a bit stream to multiplexer 604.

Multiplexer 604 switches between digital words A and B to provide successive digital words to DCO 605 based on the bit stream provided by transition signal generator 602. A selection between digital word Xn corresponding to frequency fn and digital word Xn+1 corresponding to the next successive frequency fn+1 may be responsive to the bit stream. Configuring DCO 605 to transition may include transition signal generator 602 generating the bit stream to provide the time intervals corresponding to the activation/deactivation of frequencies fn+1 and fn (as discussed above in regard to FIG. 3B).

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, one or more steps of methods or processes discussed above may be performed in a different order (or concurrently) and still achieve desirable results. Based on the above disclosure and the following claims, other arrangements, embodiments, implementations and equivalents may be employed without departing from the scope of the invention as defined by the claims.

The invention claimed is:

1. A method of comprising:
deactivating, via a transition controller and during each sub-interval of a transition time, a first frequency of a digitally controlled oscillator (DCO) generating an oscillating signal at the first frequency, the first frequency being a discrete frequency adjustment step of the DCO, the transition controller implemented at least partially in hardware; and
activating, via the transition controller and during each sub-interval of the transition time, a second frequency of the DCO to transition the oscillating signal generated by the DCO from the first frequency to the second frequency over the transition time, the second frequency being another discrete frequency step of the DCO, a first amount of time the first frequency is deactivated and a second amount of time the second frequency is activated progressively increasing during each successive sub-interval of the transition time.

2. The method as recited by claim 1, wherein the first amount of time the first frequency is deactivated during each sub-interval of the transition time is approximately equal to the second amount of time the second frequency is activated during each sub-interval of the transition time.

3. The method as recited by claim 1, wherein the first amount of time the first frequency is deactivated or the second amount of time the second frequency is activated during each successive sub-interval of the transition time progressively increases based on a linear ramp.

4. The method as recited by claim 1, wherein the first frequency is deactivated for the first amount of time or the second frequency is activated for the second amount of time during each sub-interval in response to a pulse-width modulated signal.

5. The method as recited by claim 1, further comprising:
generating a transition signal for transitioning the oscillating signal from the first frequency to the second frequency;
converting the transition signal into a bit stream for configuring the DCO; and
applying, during the transition time, the bit stream to the DCO to deactivate the first frequency and activate the second frequency.

6. The method as recited by claim 1, wherein transitioning the oscillating signal provided by the DCO from the first frequency to the second frequency over the transition time is effective to reduce distortion of a signal that is modulated or demodulated using the oscillating signal.

7. A circuit comprising:
a digitally controlled oscillator (DCO) having multiple frequency steps and configured to generate an oscillating signal based on at least a first frequency or a second frequency of the multiple frequency steps;
a transition controller operably coupled with the DCO, the transition controller configured to transition the oscillating signal generated by the DCO from the first frequency to the second frequency by:
deactivating, during each successive sub-interval of a transition time, the first frequency of the DCO for a progressively increasing amount of time; and
activating, during each successive sub-interval of the transition time, the second frequency of the DCO for another progressively increasing amount of time.

8. The circuit as recited by claim 7, wherein the transition controller is configured to activate the second frequency of the DCO for the other progressively increasing amounts of time until the oscillating signal generated by the DCO is approximately the second frequency.

9. The circuit as recited by claim 7, wherein the progressively increasing amount of time and the other progressively increasing amount of time are approximately equal for a same sub-interval of transition time.

10. The circuit as recited by claim 7, further comprising a pulse-width-modulator to provide a pulse-width-modulated signal and wherein the transition controller is further configured to increase, based on the pulse-width-modulated signal, the progressively increasing amount of time or the other progressively increasing amount of time at each successive sub-interval of transition time.

11. The circuit as recited by claim 7, further comprising a digital-signal generator to provide a transition signal, a converter to convert the transition signal into a bit stream for configuring the DCO, and wherein the transition controller is further configured to use the bit stream to deactivate the first frequency and activate the second frequency of the DCO.

12. The circuit as recited by claim 11, wherein the converter is a sigma delta modulator configured to convert the transition signal into the bit stream for configuring the DCO.

13. The circuit as recited by claim 11, wherein the transition signal provided by the digital-signal generator is a digital signal that successively increases from a first value to a second value.

14. The circuit as recited by claim 13, wherein the digital signal successively increases from the first value to the second value during the transition time.

15. A communication system comprising:
a mixer to modulate a signal or demodulate a modulated signal based on an oscillating signal;
a digitally controlled oscillator (DCO) configured to provide the oscillating signal to the mixer, the DCO having multiple frequency steps that include a first frequency and a second frequency;
a transition controller operably coupled with the DCO, the transition controller configured to:
deactivate, during successive sub-intervals of a transition time, the first frequency of the DCO for increasing amounts of time to transition the oscillating signal from the first frequency; and
activating, during successive sub-intervals of the transition time, the second frequency of the DCO when the first frequency is deactivated to transition the oscillating signal to the second frequency.

16. The communication system as recited by claim 15, further comprising a digital signal generator to provide a linear ramp and wherein the transition controller is configured to determine the increasing amounts of time for each successive sub-interval using the linear ramp.

17. The communication system as recited by claim 15, further comprising a modulator to provide a pulse-width-modulated signal and wherein the transition controller is configured to determine the increasing amounts of time for each successive sub-interval using the pulse-width-modulated signal.

18. The communication system as recited by claim 15, further comprising a digital signal generator to provide a transition signal, a converter to convert the transition signal into a bit stream for configuring the DCO, and wherein the transition controller is configured to use the bit stream to deactivate the first frequency and activate second frequency.

19. The communication system as recited by claim 15, wherein the signal is a radio frequency signal, baseband signal, or audio signal.

20. The communication system as recited by claim 15, further comprising an amplifier to amplify the signal or the modulated signal.

* * * * *